United States Patent
Tsujiko et al.

(10) Patent No.: US 8,299,800 B2
(45) Date of Patent: Oct. 30, 2012

(54) METHOD OF DIAGNOSING A MALFUNCTION IN AN ABNORMAL VOLTAGE DETECTING APPARATUS, SECONDARY BATTERY SYSTEM, AND HYBRID VEHICLE

(75) Inventors: Akira Tsujiko, Miyoshi (JP); Tomitaro Hara, Okazaki (JP); Takuichi Arai, Toyota (JP); Yohei Shindo, Nisshin (JP); Takeshi Abe, Okazaki (JP); Daisuke Teramoto, Toyota (JP); Keiko Wasada, Toyota (JP); Sachie Yuasa, Okazaki (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 78 days.

(21) Appl. No.: 13/000,695

(22) PCT Filed: Jun. 24, 2009

(86) PCT No.: PCT/IB2009/006033
§ 371 (c)(1),
(2), (4) Date: Feb. 23, 2011

(87) PCT Pub. No.: WO2009/156825
PCT Pub. Date: Dec. 30, 2009

(65) Prior Publication Data
US 2011/0133721 A1 Jun. 9, 2011

(51) Int. Cl.
*G01N 27/416* (2006.01)
*G01R 31/28* (2006.01)
*H02J 7/04* (2006.01)
(52) U.S. Cl. .................. 324/426; 324/522; 320/165
(58) Field of Classification Search .............. 324/74, 324/76.11, 103 R, 140 R–142, 426–450, 324/522, 764.01; 320/165
See application file for complete search history.

(56) References Cited

U.S. PATENT DOCUMENTS

| 5,861,898 | A | 1/1999 | Nakanishi |
| 6,614,232 | B1* | 9/2003 | Mukai ............................ 324/426 |
| 7,009,401 | B2* | 3/2006 | Kinoshita et al. ............. 324/430 |
| 7,173,397 | B2* | 2/2007 | Kinoshita et al. ............. 320/134 |
| 7,432,719 | B2* | 10/2008 | Nozaki ........................... 324/522 |

(Continued)

FOREIGN PATENT DOCUMENTS

JP 5-137239 6/1993

(Continued)

OTHER PUBLICATIONS

International Search Report in International Application No. PCT/IB2009/006033; Mailing Date: Dec. 1, 2009.

(Continued)

*Primary Examiner* — Joshua Benitez Rosario
(74) *Attorney, Agent, or Firm* — Finnegan, Henderson, Farabow, Garrett & Dunner, LLP

(57) ABSTRACT

The invention provides a method of diagnosing a malfunction in an abnormal voltage detecting apparatus, which includes breaking an electrical connection between a secondary battery (100) and an abnormal voltage detecting apparatus (40, 31) and connecting the abnormal voltage detecting apparatus to a direct current voltage generating portion (20) that is different from the secondary battery (100), applying direct current voltage that has a predetermined voltage value that is outside of a normal voltage range to the abnormal voltage detecting apparatus (40) using the direct current voltage generating portion, and determining that there is a malfunction in the abnormal voltage detecting apparatus if the abnormal voltage detecting apparatus does not determine that the voltage is abnormal.

9 Claims, 7 Drawing Sheets

U.S. PATENT DOCUMENTS

| | | | |
|---|---|---|---|
| 7,495,417 B2 * | 2/2009 | Ishishita | 320/134 |
| 7,635,983 B2 * | 12/2009 | Pecile | 324/426 |
| 7,688,074 B2 * | 3/2010 | Cox et al. | 324/426 |
| 7,714,543 B2 * | 5/2010 | Yoshida | 320/134 |
| 7,768,266 B2 * | 8/2010 | Yamaguchi | 324/430 |
| 8,148,993 B2 * | 4/2012 | Yamabe et al. | 324/433 |
| 8,203,345 B2 * | 6/2012 | Bertness | 324/426 |
| 2004/0183541 A1 | 9/2004 | Hald et al. | |
| 2008/0204031 A1 * | 8/2008 | Iwane et al. | 324/430 |
| 2009/0251103 A1 * | 10/2009 | Yamamoto et al. | 320/133 |

FOREIGN PATENT DOCUMENTS

| | | |
|---|---|---|
| JP | 2004-127663 | 4/2004 |
| JP | 2004-312835 | 11/2004 |
| JP | 2007-20336 | 1/2007 |

OTHER PUBLICATIONS

Notification of Reason(s) for Refusal in Japanese Patent Application No. 2008-165999; Drafting Date: May 19, 2010. Excerpt.

International Preliminary Report on Patentability in International Application No. PCT/IB2009/006033; Completion Date: Sep. 6, 2010.

Written Opinion of the International Searching Authority in International Application No. PCT/IB2009/006033; Mailing Date: Dec. 1, 2009.

Response to Written Opinion of the International Searching Authority in International Application No. PCT/IB2009/006033 (Apr. 20, 2010).

* cited by examiner

METHOD OF DIAGNOSING A MALFUNCTION IN AN ABNORMAL VOLTAGE DETECTING APPARATUS, SECONDARY BATTERY SYSTEM, AND HYBRID VEHICLE

CROSS-REFERENCE TO RELATED APPLICATIONS

This application is a national phase application of International Application No. PCT/IB2009/006033, filed Jun. 24, 2009, and claims the priority of Japanese Application No. 2008-165999, filed Jun. 25, 2008, the contents of both of which are incorporated herein by reference.

FIELD OF THE INVENTION

The invention relates to i) a method of diagnosing a malfunction in a abnormal voltage detecting apparatus, ii) a secondary battery system, and iii) a hybrid vehicle.

BACKGROUND OF THE INVENTION

Some secondary battery systems are provided with an abnormal voltage detecting apparatus that detects abnormal battery voltage, in order to prevent overcharging (i.e., an excessive increase in battery voltage) and overdischarging (i.e., an excessive decrease in battery voltage) of a secondary battery. For example, the voltage of the secondary battery is detected and if the detected voltage value is outside of a normal voltage range, the voltage in the secondary battery is determined to be abnormal. More specifically, upper and lower limit values for battery voltage are set in advance, and if during charging the detected voltage value exceeds the upper limit value, it is determined that the secondary battery is overcharged. Conversely, if during discharging the detected voltage value is below the lower limit value, it is determined that the secondary battery is overdischarged. Controlling charging and discharging of the secondary battery based on the determination by the abnormal voltage detecting apparatus enables overcharging and overdischarging of the secondary battery to be avoided.

However, if there is a malfunction in the abnormal voltage detecting apparatus such that it is no longer able to accurately determine whether the voltage of the secondary battery is within the normal voltage range, then it is no longer possible to avoid overcharging and overdischarging the secondary battery. Japanese Patent Application Publication No. 2004-312835 (JP-A-2004-312835) and Japanese Patent Application Publication No. 2007-20336 (JP-A-2007-20336) describe methods of diagnosing a malfunction in this kind of abnormal voltage detecting apparatus.

The method described in JP-A-2004-312835 is as described below. A secondary battery is charged using power generated by a regenerative operation of a motor mounted in a hybrid vehicle until the voltage of the secondary battery exceeds an upper limit voltage value. If an abnormality detection signal is output from the abnormal voltage detecting apparatus after the voltage of the secondary battery exceeds the upper limit voltage value, it is determined that the abnormal voltage detecting apparatus is operating normally, i.e., is not malfunctioning.

JP-A-2007-20336 describes a method of diagnosing a malfunction in an abnormality detecting apparatus using the voltage of a secondary battery while the secondary battery is discharging. More specifically, if an overcharging abnormality signal is output from an abnormality detecting circuit while the secondary battery is discharging, it is determined that there is a malfunction in the abnormality detecting circuit. Furthermore, if an overdischarging abnormality signal is output from the abnormality detecting circuit while the secondary battery is charging, it is determined that there is a malfunction in the abnormality detecting circuit.

However, with the diagnostic method described in JP-A-2004-312835, the secondary battery must continue to be charged using power generated by regenerative operation of the motor mounted in the hybrid vehicle until the voltage of the secondary battery exceeds the upper limit voltage value. Therefore, in order to determine that there is a malfunction in the abnormality detecting circuit in a hybrid vehicle that is running, the brake must continue to be applied until the voltage of the secondary battery exceeds the upper limit voltage value, which is not very practical. Moreover, charging the secondary battery until its voltage exceeds the upper limit voltage value overcharges the secondary battery, which may cause the secondary battery to deteriorate.

Also, the diagnostic method described in JP-A-2007-20336 is not able to detect some malfunctions. More specifically, for example, if there is a malfunction in which the actual voltage value of the secondary battery does not match the voltage value obtained by the abnormality detecting circuit, an overcharging abnormality signal (or an overdischarging abnormality signal) will not be output from the abnormality detecting circuit while the secondary battery is discharging (or charging). Therefore, this kind of malfunction is unable to be detected with the diagnostic method described in JP-A-2007-20336.

Also, both of the diagnostic methods described in JP-A-2004-312835 and JP-A-2007-20336 diagnose whether there is a malfunction in the abnormal voltage detecting apparatus using the battery voltage when the secondary battery, which is provided as a power supply in a hybrid vehicle or an electric vehicle, is charging or discharging. However, the battery voltage when the secondary battery mounted in a hybrid vehicle or the like is charging or discharging is unstable, so it may not be possible to accurately diagnose whether there is a malfunction in the abnormal voltage detecting apparatus.

SUMMARY OF THE INVENTION

This invention thus provides i) a method of diagnosing a malfunction in an abnormal voltage detecting apparatus, which can accurately diagnose whether there is a malfunction in an abnormal voltage detecting apparatus without causing a secondary battery to deteriorate, ii) a secondary battery system, and iii) a hybrid vehicle.

A first aspect of the invention relates to a method of diagnosing a malfunction in an abnormal voltage detecting apparatus. More specifically, this method determines whether there is a malfunction in an abnormal voltage detecting apparatus which detects the voltage of a secondary battery and determines that the voltage of the secondary battery is abnormal when the detected voltage value is outside of a normal voltage range. This method of diagnosing a malfunction in an abnormal voltage detecting apparatus includes breaking an electrical connection between the abnormal voltage detecting apparatus and the secondary battery; connecting the abnormal voltage detecting apparatus to a direct current voltage generating portion which is different than the secondary battery and is able to generate direct current voltage that has a predetermined voltage value that is outside of the normal voltage range; applying the direct current voltage that has the predetermined voltage value that is outside of the normal voltage range to the abnormal voltage detecting apparatus using the direct current voltage generating portion; and determining that there is a malfunction in the abnormal voltage detecting apparatus if it is not determined by the abnormal voltage detecting apparatus that the voltage is abnormal.

According to the method of diagnosing a malfunction in an abnormal voltage detecting apparatus, the electrical connection between the abnormal voltage detecting apparatus and the secondary battery is broken, while the abnormal voltage detecting apparatus is connected to a direct current voltage generating portion that is different than the secondary battery. As a result, direct current voltage with little voltage fluctuation can be stably applied to the abnormal voltage detecting apparatus from the direct current voltage generating portion.

Therefore, it is possible to accurately determine whether there is a malfunction in the abnormal voltage detecting apparatus by having the direct current voltage generating portion apply direct current voltage that has a predetermined voltage value that is outside of the normal voltage range to the abnormal voltage detecting apparatus and having the abnormal voltage detecting apparatus determine whether that voltage is abnormal. Furthermore, the secondary battery is not made to overcharge or overdischarge to perform the malfunction diagnostic on the abnormal voltage detecting apparatus, so the secondary battery will not deteriorate due to that diagnostic being performed.

In the method of diagnosing a malfunction in an abnormal voltage detecting apparatus, the direct current voltage generating portion may be structured to be able to generate direct current voltage that has a constant voltage value that is outside of the normal voltage range.

In the method of diagnosing a malfunction in an abnormal voltage detecting apparatus, the direct current voltage generating portion may include a converting apparatus capable of converting voltage from an external power supply that is different than the secondary battery into the direct current voltage that has a predetermined voltage value that is outside of the normal voltage range. The method may also include electrically connecting the converting apparatus and the abnormal voltage detecting apparatus to the external power supply; converting the voltage from the external power supply into the direct current voltage; and applying the converted direct current voltage to the abnormal voltage detecting apparatus.

According to this malfunction diagnostic method, the direct current voltage generating portion is able to convert the voltage from an external power supply into direct current voltage, and apply that converted direct current voltage to the abnormal voltage detecting apparatus. As a result, the malfunction diagnostic can be performed accurately on the abnormal voltage detecting apparatus.

Furthermore, the external power supply may be a commercial power supply.

Using the commercial power supply as the external power supply enables the malfunction diagnostic to be performed easily and inexpensively on the abnormal voltage detecting apparatus.

A second aspect of the invention relates to a secondary battery system. This secondary battery system includes a secondary battery; an abnormal voltage detecting apparatus which is able to be electrically connected to and disconnected from the secondary battery and detects the voltage of the secondary battery and determines that the voltage of the secondary battery is abnormal if the detected voltage value is outside of a normal voltage range; and a direct current voltage generating portion which i) is able to be electrically connected to and disconnected from the abnormal voltage detecting apparatus, ii) is able to generate direct current voltage that has a predetermined voltage value that is outside of the normal voltage range, and iii) is different than the secondary battery. It is determined that there is a malfunction in the abnormal voltage detecting apparatus if the abnormal voltage detecting apparatus does not determine that the voltage of the secondary battery is abnormal when the abnormal voltage detecting apparatus is electrically disconnected from the secondary battery and connected to the direct current voltage generating portion, and the direct current generating portion applies the direct current voltage to the abnormal voltage detecting apparatus.

It is possible to accurately determine whether there is a malfunction in the abnormal voltage detecting apparatus by having the direct current voltage generating portion apply direct current voltage that has a predetermined voltage value that is outside of the normal voltage range to the abnormal voltage detecting apparatus and having the abnormal voltage detecting apparatus determine whether that voltage is abnormal. Furthermore, the secondary battery is not made to overcharge or overdischarge by performing the malfunction diagnostic on the abnormal voltage detecting apparatus, so the secondary battery will not deteriorate due to that diagnostic being performed.

The direct current voltage generating portion may be structured to be able to generate direct current voltage that has a constant voltage value that is outside of the normal voltage range.

The secondary battery system may also include a malfunction determining portion which determines that there is a malfunction in the abnormal voltage detecting apparatus when the direct current voltage is applied to the abnormal voltage detecting apparatus and the abnormal voltage detecting apparatus does not determine that the voltage of the secondary battery is abnormal.

This secondary battery system includes the malfunction determining portion that determines whether there is a malfunction in the abnormal voltage detecting apparatus. Therefore, the malfunction determining portion is able to accurately determine whether there is a malfunction in the abnormal voltage detecting apparatus.

Further, the secondary battery system may also include a converting apparatus which i) is able to convert voltage from an external power supply into the direct current voltage, ii) is able to be electrically connected to the abnormal voltage detecting apparatus, and iii) is provided in the direct current voltage generating portion; and a connecting portion which is able to be electrically connected to the converting apparatus and the external power supply, and electrically connects the converting apparatus to the external power supply. In this secondary battery system, when the connecting portion is electrically connected to the external power supply, the secondary battery system may break the electrical connection between the abnormal voltage detecting apparatus and the secondary battery, and electrically connect the abnormal voltage detecting apparatus to the converting apparatus and the connecting portion.

With this secondary battery system, non-fluctuating direct current constant voltage is applied to the abnormal voltage detecting apparatus, so it is possible to accurately diagnose whether there is a malfunction in the abnormal voltage detecting apparatus. Moreover, an external power supply is used so there is no need to provide a separate power supply for performing the malfunction diagnostic in the secondary battery system.

In the secondary battery system, the secondary battery may be able to be charged using power supplied from the external power supply while the connecting portion is electrically connected to the external power supply.

With this secondary battery system, the secondary battery can also be charged using the power supplied from the external power supply. In this way, both the secondary battery can be charged and the malfunction diagnostic can be performed on the abnormal voltage detecting apparatus using the external power supply.

Furthermore, in the secondary battery system, the secondary battery may start to be charged when the connecting portion is electrically connected to the external power supply, after a malfunction diagnostic has been performed on the abnormal voltage detecting apparatus or while the malfunction diagnostic is being performed on the abnormal voltage detecting apparatus.

With this secondary battery system, both the malfunction diagnostic can be performed on the abnormal voltage detecting apparatus and the secondary battery can be charged by simply electrically connecting the connecting portion to the external power supply, which makes this system extremely efficient.

Moreover, in the secondary battery system, the external power supply may be a commercial power supply.

Using the commercial power supply as the external power supply enables the malfunction diagnostic to be performed easily and inexpensively on the abnormal voltage detecting apparatus.

Furthermore, in the secondary battery system, the secondary battery may include an electrode body that has a cathode, a separator, and an anode. The cathode may include cathode active material that performs two-phase charging-discharging, and the anode may include anode active material that follows a phase transition from charging and discharging.

The secondary battery of the secondary battery system of the invention includes a cathode that includes cathode active material that performs two-phase charging-discharging, and an anode that includes anode active material that follows a phase transition from charging and discharging. This secondary battery is characteristic in that the voltage fluctuation is extremely small over a wide capacity range. Therefore, stable power can be provided by using voltage within the capacity range where the voltage fluctuation is extremely small (hereinafter this range may also be referred to as "flat capacity range"). However, if the secondary battery is charged above this flat capacity range, the battery voltage suddenly rises. Conversely, if the secondary battery is discharged below this flat capacity range, the battery voltage suddenly falls. Therefore, unless the battery voltage of the secondary battery is accurately detected by the abnormal voltage detecting apparatus and charging and discharging of the secondary battery are controlled, the secondary battery may easily become overdischarged or overcharged.

However, with the secondary battery system of the invention, the malfunction diagnostic is able to be accurately performed on the abnormal voltage detecting apparatus, so the accuracy with which the abnormal voltage detecting apparatus detects abnormal voltage can be kept high. Therefore, overdischarging and overcharging of the secondary battery are able to be prevented because the battery voltage of the secondary battery can be monitored using the abnormal voltage detecting apparatus which is able to accurately detect abnormal voltage.

A third aspect of the invention relates to a hybrid vehicle. This hybrid vehicle is provided with the secondary battery system described above.

This hybrid vehicle is provided with the secondary battery system described above. Therefore, a malfunction diagnostic is able to be accurately performed on the abnormal voltage detecting apparatus. Moreover, the secondary battery is not made to overcharge or overdischarge by performing the malfunction diagnostic on the abnormal voltage detecting apparatus, so deterioration of the secondary battery can also be suppressed.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF THE EMBODIMENTS

Figure 1:
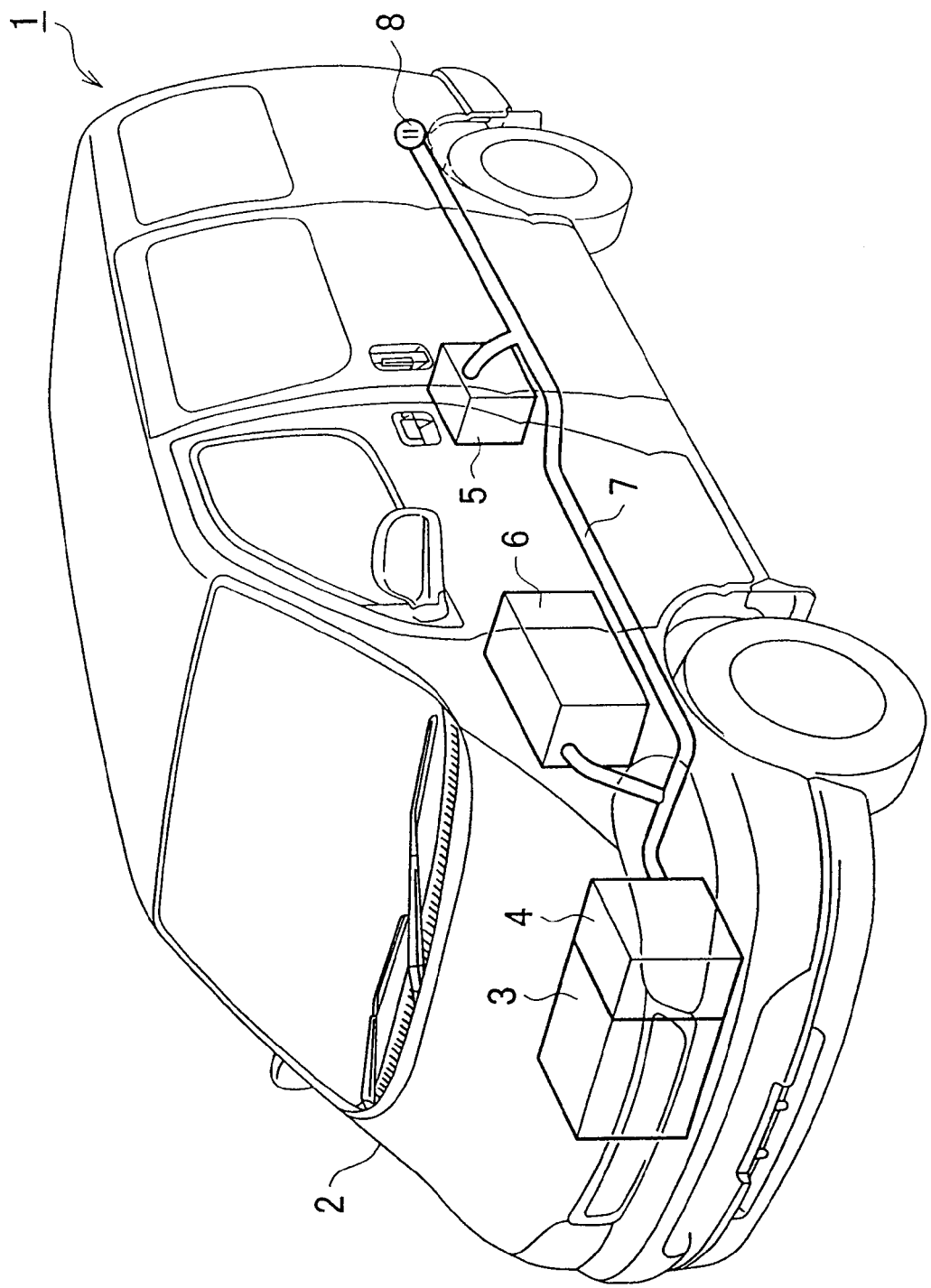
FIG. 1 is a schematic diagram of a hybrid vehicle according to an example embodiment of the invention.
Figure 2:
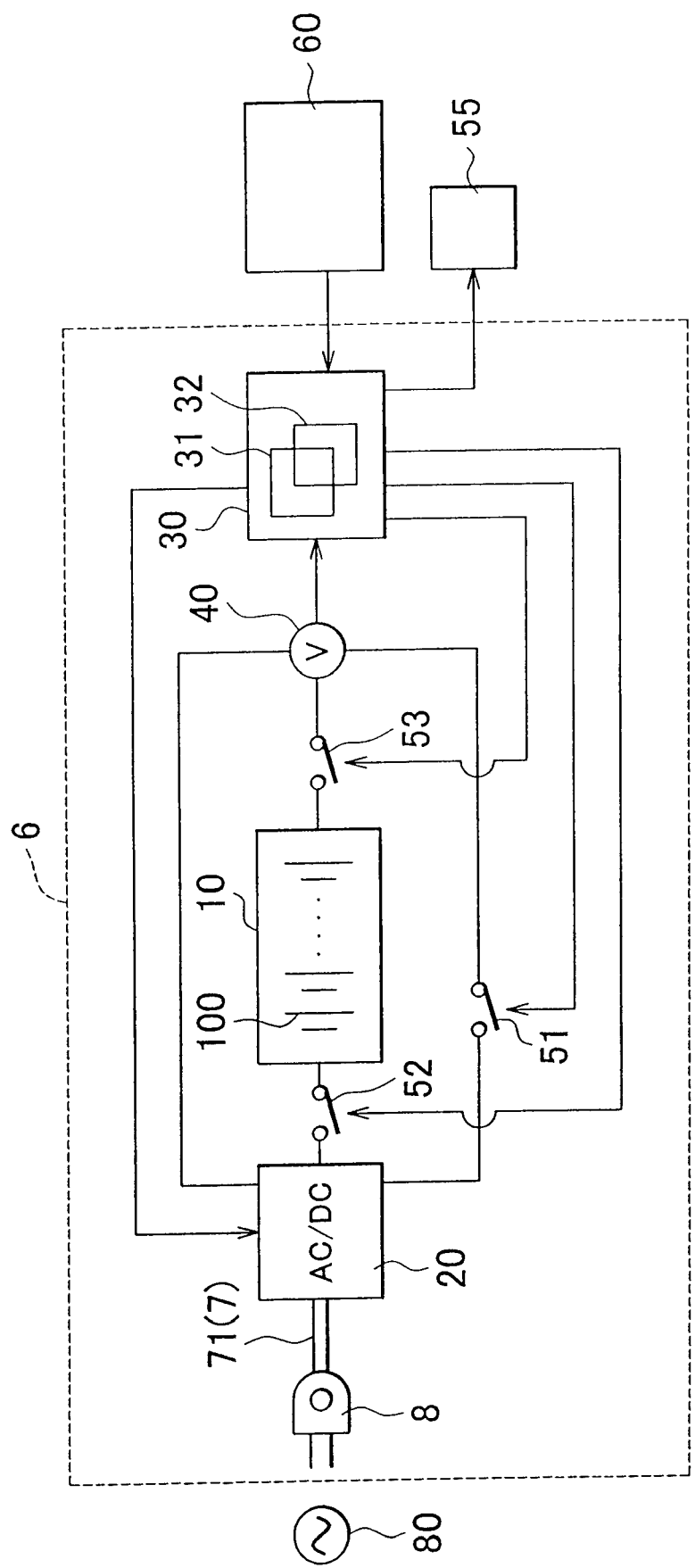
FIG. 2 is a schematic diagram of a secondary battery system according to the example embodiment.

Example embodiments of the present invention will be described in greater detail below with reference to the accompanying drawings. A hybrid vehicle 1 includes a vehicle body 2, an engine 3, a front motor 4, a rear motor 5, and a secondary battery system 6, as shown in FIG. 1, and is driven by a combination of the engine 3, the front motor 4, and the rear motor 5. More specifically, the hybrid vehicle 1 is able to run using the engine 3, the front motor 4, and the rear motor 5, as is well known, with a battery pack 10 (see FIG. 2), which included in the secondary battery system 6, as the power supply for driving the front motor 4 and the rear motor 5.

The secondary battery system 6 is mounted to the vehicle body 2 of the hybrid vehicle 1 and is connected to the front motor 4 and the rear motor 5 by a cable 7. This secondary battery system 6 includes the battery pack 10 in which a plurality of secondary batteries (i.e., battery cells) are electrically connected together in series, a converting apparatus 20, a battery controller 30, a voltage sensor 40, and a connecting portion 8.

The converting apparatus 20 is formed by an AC/DC converter and is able to convert the voltage of a commercial power supply 80 into direct current (DC) constant voltage having a constant voltage value. The converting apparatus 20 is electrically connected to the connecting portion 8 by a cable 71 that is included in the cable 7. The converting apparatus 20 is also electrically connected to the battery pack 10 via a switch 52. Incidentally, the converting apparatus 20 in this example embodiment corresponds to a direct current voltage generating portion.

Also, the connecting portion 8 is formed by a power supply plug and can be electrically connected to the commercial power supply 80. This connecting portion 8 is electrically connected to the converting apparatus 20. Accordingly, the converting apparatus 20 can be electrically connected to the commercial power supply 80 via this connecting portion 8. Incidentally, in this example embodiment, the connecting portion 8 and the cable 71 can both be pulled out of the hybrid vehicle 1, so the connecting portion 8 can be connected to the commercial power supply 80 away from the hybrid vehicle 1.

The voltage sensor 40 detects the battery voltage V (i.e., the voltage between terminals) of the secondary batteries 100 that make up the battery pack 10. The battery controller 30 has an abnormal voltage determining portion 31 and a malfunction determining portion 32 that are formed by ROM, a CPU, and RAM and the like, not shown. The abnormal voltage determining portion 31 of the battery controller 30 obtains the battery voltages of the secondary batteries 100 detected by the voltage sensor 40 and determines whether the battery voltage values are outside of a normal voltage range. If any of the battery voltage values are outside of the normal voltage range, the voltage of the secondary batteries 100 is determined to be abnormal. Incidentally, in this example embodiment, the voltage sensor 40 and the abnormal voltage determining portion 31 of the battery controller 30 correspond to an abnormal voltage detecting apparatus.

Also, the voltage sensor 40 is electrically connected to the converting apparatus 20 via a switch 51. That is, the voltage sensor 40 that makes up part of the abnormal voltage detecting apparatus can be electrically connected to or disconnected from the converting apparatus 20. The voltage sensor 40 is also electrically connected to the battery pack 10 via a switch 53. That is, the voltage sensor 40 that makes up part of the abnormal voltage detecting apparatus can be electrically connected to or disconnected from the secondary batteries 100 that make up the battery pack 10.

In this secondary battery system 6, when the battery pack 10 is charging or discharging while the hybrid vehicle 1 is running, the battery voltages of the secondary batteries 100 that make up the battery pack 10 are detected by the voltage sensor 40 when the switch 51 is off (i.e., the circuit is open) and the switches 52 and 53 are on (i.e., the circuits are closed). Furthermore, the abnormal voltage determining portion 31 of the battery controller 30 determines whether the detected battery voltages are outside of the normal voltage range. If any of the battery voltages are outside of the normal voltage range, the voltages of the secondary batteries 100 are determined to be abnormal. Incidentally in this example embodiment, the normal voltage range is between 3.0 V and 3.7 V, for example. This normal voltage range is stored in advance in the ROM, not shown, of the abnormal voltage determining portion 31.

Incidentally in this example embodiment, if the abnormal voltage determining portion 31 of the battery controller 30 determines that the voltages of the secondary batteries 100 are abnormal, charging and discharging of the battery pack are immediately stopped, thereby preventing the secondary batteries 100 that make up the battery pack 10 from overdischarging (i.e., preventing the battery voltage from decreasing excessively) and overcharging (i.e., preventing the battery voltage from increasing excessively).

Also, in this secondary battery system 6, when the hybrid vehicle 1 is stopped, a malfunction diagnostic (hereinafter also referred to simply as "diagnostic") can be performed on the abnormal voltage detecting apparatus (i.e., the voltage sensor 40 and the abnormal voltage determining portion 31). More specifically, when the connecting portion 8 is electrically connected to the commercial power supply 80, the battery controller 30 breaks the electrical connection between the abnormal voltage detecting apparatus (i.e., the voltage sensor 40 and the abnormal voltage determining portion 31) and the secondary batteries 100 by turning the switches 52 and 53 off, and electrically connects the abnormal voltage detecting apparatus with the converting apparatus 20 by turning the switch 51 on. In this state, the battery controller 30 directs the converting apparatus 20 to convert the voltage of the commercial power supply 80 into DC constant voltage having a constant voltage value (such as 4.0 V) that is outside of the normal voltage range of the secondary batteries 100.

Accordingly, DC constant voltage having a constant voltage value that is outside of the normal voltage range can be applied to the voltage sensor 40. If at this time the abnormal voltage detecting apparatus (i.e., the voltage sensor 40 and the abnormal voltage determining portion 31) is operating normally, the voltage sensor 40 will accurately detect the DC constant voltage (such as DC 4.0 V) having a constant voltage value that is outside of the normal voltage range, and the abnormal voltage determining portion 31 will determine that the voltage is abnormal based on the detected voltage value. In this case, the abnormal voltage determining portion 31 outputs an abnormal voltage signal to the malfunction determining portion 32, and the malfunction determining portion 32 determines that the abnormal voltage detecting apparatus is operating normally.

If, on the other hand, the abnormal voltage determining portion 31 does not determine that the voltage is abnormal, the abnormal voltage determining portion 31 does not output an abnormal voltage signal. In this case, the malfunction determining portion 32 determines that there is a malfunction in the abnormal voltage detecting apparatus (i.e., the voltage sensor 40 and the abnormal voltage determining portion 31). Then the malfunction determining portion 32 outputs a malfunction detected signal and illuminates a malfunction indicator lamp 55.

Therefore, the person conducting the diagnostic is able to determine whether there is a malfunction in the abnormal voltage detecting apparatus (i.e., the voltage sensor 40 and the abnormal voltage determining portion 31) by checking whether the malfunction indicator lamp 55 is illuminated. That is, if the malfunction indicator lamp 55 is not illuminated, it can be determined that the abnormal voltage detecting apparatus is operating normally. If, on the other hand, the malfunction indicator lamp 55 is illuminated, it can be determined that there is a malfunction in the abnormal voltage detecting apparatus.

If the abnormal voltage detecting apparatus is directed to determine whether the voltage is abnormal while unstable (i.e., fluctuating) DC voltage (such as the voltage of the secondary battery during charging or discharging) is applied to the voltage sensor, the fluctuation in the applied DC voltage may make it impossible to accurately diagnose whether there is a malfunction in the abnormal voltage detecting apparatus.

However, with the secondary battery system 6 in this example embodiment, the abnormal voltage determining portion 31 of the battery controller 30 is directed to determine whether the voltage is abnormal while stable (i.e., non-fluctuating) DC constant voltage is applied to the voltage sensor 40. Therefore, it is possible to accurately diagnose whether there is a malfunction in the abnormal voltage detecting apparatus (i.e., the voltage sensor 40 and the abnormal voltage determining portion 31). Moreover, the secondary batteries 100 are not made to overcharge or overdischarge in order to perform the malfunction diagnostic on the abnormal voltage detecting apparatus, so the secondary batteries 100 will not deteriorate as a result of the diagnostic.

Further, in this secondary battery system 6, when the hybrid vehicle 1 is stopped and the connecting portion 8 is electrically connected to the commercial power supply 80, the secondary batteries 100 that make up the battery pack 10 can be charged using power supplied from the commercial power supply 80 by turning the switch 51 off and turning the switches 52 and 53 on. More specifically, the secondary batteries 100 can be charged by supplying power from the commercial power supply 80 to the secondary batteries 100 that make up the battery pack 10 via the converting apparatus 20, while converting the voltage from the commercial power supply 80 into DC constant voltage that has a predetermined constant voltage value using the converting apparatus 20.

Figure 3:
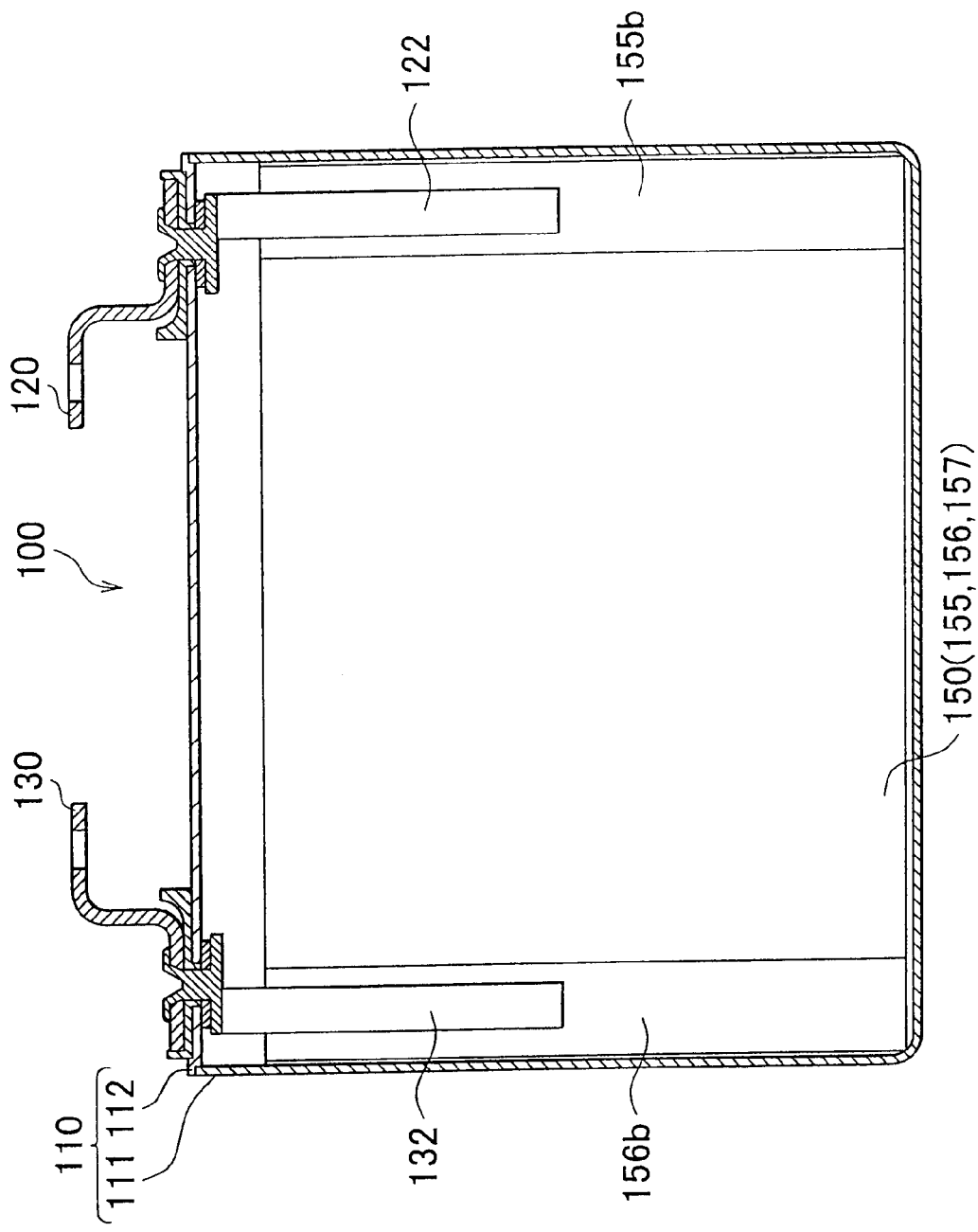
FIG. 3 is a sectional view of the secondary battery according to the example embodiment.

The secondary batteries 100 are hermetically-sealed rectangular lithium-ion secondary batteries, each of which has a rectangular parallelepiped battery case 110, a positive terminal 120 and a negative terminal 130, as shown in FIG. 3. The battery case 110 is made of metal and has a rectangular housing portion 111 that forms a rectangular parallelepiped space, and a metal cover 112. An electrode body 150, a cathode collector member 122, and an anode collector member 132 and the like are housed in the battery case 110 (i.e., rectangular housing portion 111).

Figure 4:
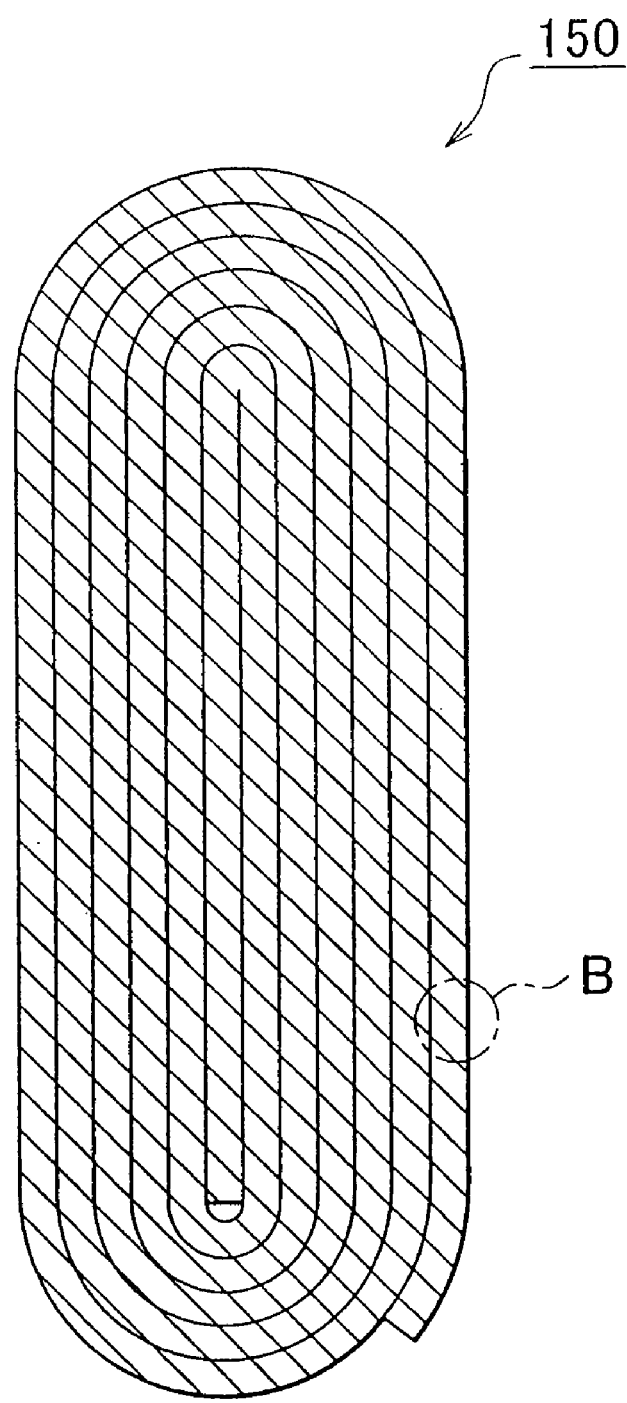
FIG. 4 is a sectional view of an electrode body according to the example embodiment.
Figure 5:
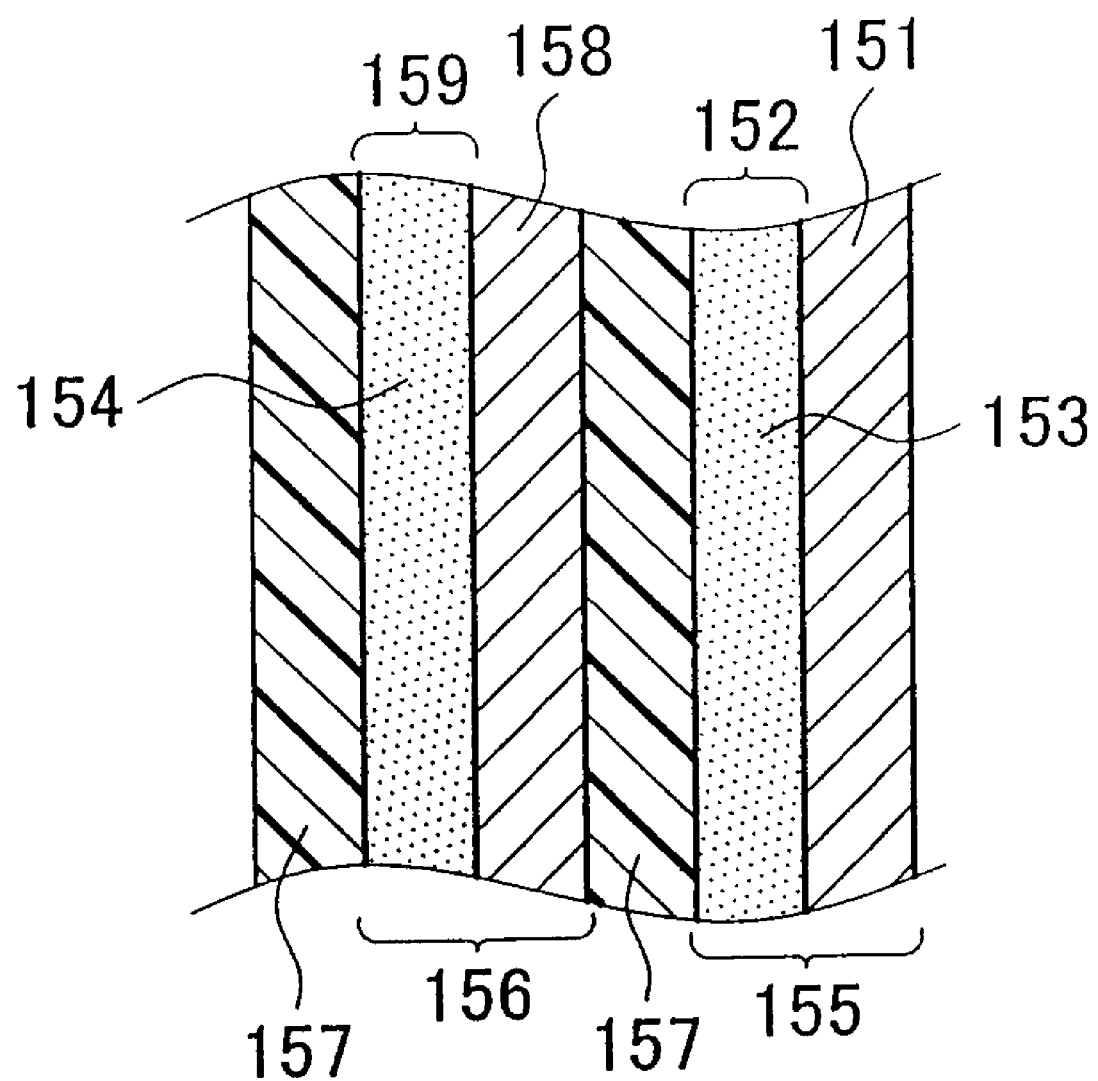
FIG. 5 is a partial enlarged sectional view of the electrode body according to the example embodiment, which corresponds to an enlarged view of portion B in FIG. 4.

The electrode body 150 is a flat spirally-wound body which is formed by winding a sheet-like cathode 155, a sheet-like separator 157, and a sheet-like anode 156 in a spiral, as shown in FIG. 5, and has an oblong cross-section as shown in FIG. 4. This electrode body 150 has a cathode wound portion 155b and an anode wound portion 156b. The cathode wound portion 155b is positioned on one end (i.e., the right end in FIG. 3) in the axial direction (i.e., the left-right direction in FIG. 3) of the electrode body 150, and is a portion where only a portion of the cathode 155 is layered in a spiral. The anode wound portion 156b is positioned on the other end (i.e., the left end in FIG. 3) in the axial direction (i.e., the left-right direction in FIG. 3) of the electrode body 150, and is a portion where only a portion of the anode 156 is layered in a spiral. A cathode composite 152 containing cathode active material 153 is applied to the cathode 155 except at the cathode wound portion 155b (see FIG. 5). Similarly, an anode composite 159 containing anode active material 154 is applied to the anode 156 except at the anode wound portion 156b (see FIG. 5). The cathode wound portion 155b is electrically connected to the positive terminal 120 via the cathode collector member 122. The anode wound portion 156b is electrically connected to the negative terminal 130 via the anode collector member 132.

In this example embodiment, $LiFePO_4$ is used as the cathode active material 153. This cathode active material 153 is active material that performs two-phase charging-discharging, in which a charging-discharging reaction takes place while two crystals with different crystalline structures coexist.

Also, in this example embodiment, natural graphite carbon material is used as the anode active material 154. Specifically, natural graphite material is used which has a degree of graphitization of equal to or greater than 0.9, an average particle size of 20 μm, a lattice constant C0 of 0.67 nm, and a crystallite size Lc of 27 nm. This anode active material 154 is active material that follows a phase transition from charging and discharging, in which the crystalline structure changes during charging and discharging.

Figure 6:
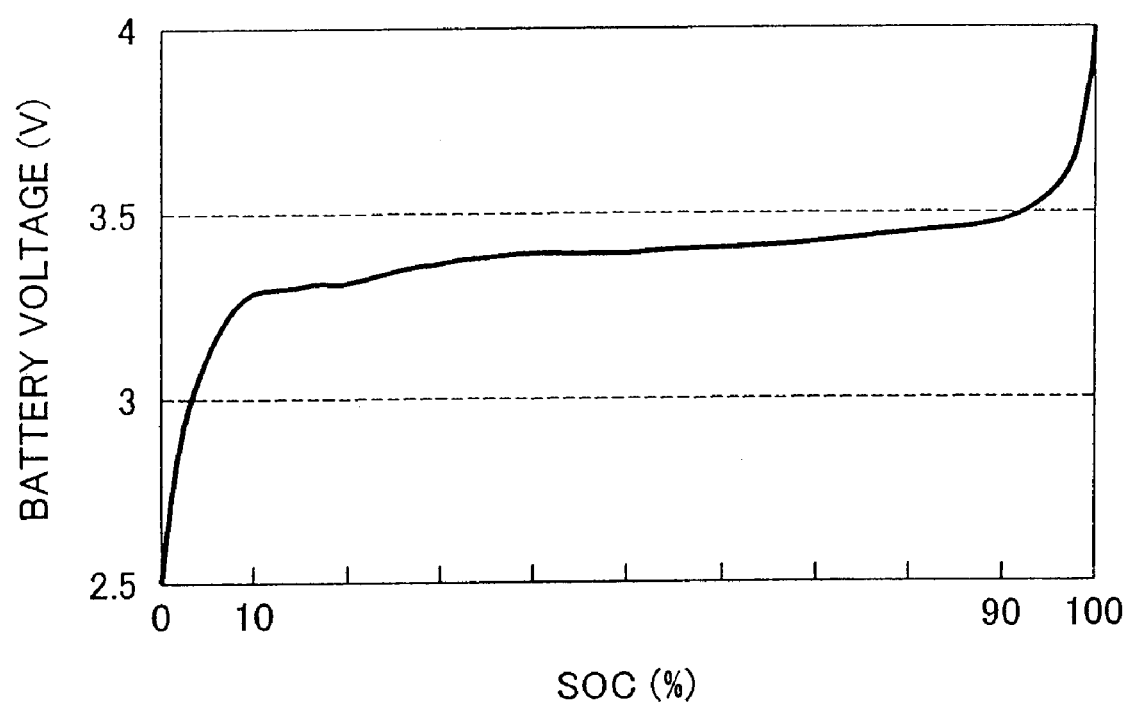
FIG. 6 is a charging-discharging characteristics diagram of the secondary battery.

Next, FIG. 6 is a charging-discharging characteristics diagram of the secondary batteries 100, which shows the behavior of the battery voltage V (the voltage between the positive terminal 120 and the negative terminal 130 in this example embodiment) when the secondary batteries 100 are charged and discharged. Incidentally, the current value at which the theoretical electrical capacity, which is the maximum amount of electricity theoretically able to be stored by the cathode active material 153 ($LiFePO_4$) in the secondary batteries 100, can be charged in one hour is designated as 1C.

As is evident from FIG. 6, the secondary batteries 100 are able to charge and discharge an electrical quantity that corresponds to approximately 80% of the theoretical electrical capacity (a SOC (state-of-charge) range from 0 to 100% in FIG. 6) at a battery voltage of near 3.4 V (i.e., 3.3 to 3.5 V). Therefore, with the secondary battery system 6 of this example embodiment, the secondary batteries 100 can be made to charge and discharge at a relatively high battery voltage of approximately 3.4 V across a capacity range (a flat capacity range) of approximately 80% of the theoretical electrical capacity, so high output can be stably obtained.

However, as shown in FIG. 6, when the secondary batteries 100 are charged above 90% (SOC of 90% in FIG. 6) of the theoretical electrical capacity, the battery voltage rises rapidly. Conversely, when the secondary batteries 100 are discharged below 10% (SOC of 10% in FIG. 6) of the theoretical electrical capacity, the battery voltage falls rapidly. Therefore, unless charging and discharging of the secondary batteries 100 are controlled by the battery controller 30 while the battery voltage of the secondary batteries 100 is accurately detected by the voltage sensor 40, the secondary batteries 100 may easily become overdischarged or overcharged.

However, in this example embodiment, the malfunction diagnostic is able to be accurately performed on the abnormal voltage detecting apparatus (i.e., the abnormal voltage determining portion 31 and the voltage sensor 40), so the accuracy with which the abnormal voltage detecting apparatus detects abnormal voltage can be kept high. Therefore, overdischarging and overcharging of the secondary batteries 100 are able to be prevented because the battery voltage of the secondary batteries 100 can be monitored using the abnormal voltage detecting apparatus which is able to accurately detect abnormal voltage.

Now, a method for manufacturing each of the secondary batteries 100 will be described. First, a cathode slurry is prepared by mixing $LiFePO_4$ (i.e., the cathode active material 153), acetylene black (a conductive agent), and polyvinylidene-fluoride (a binder resin) together at a ratio of 85:5:10 (ratio by weight), and then adding N-methylpyrrolidone (a dispersion solvent) to that mixture. Next, this cathode slurry is applied to the surface of aluminum foil 151 and dried, after which the aluminum foil 151 with the dried cathode coating is press-formed to obtain a cathode 155 in which a cathode composite 152 is applied to the surface of the aluminum foil 151 (see FIG. 5).

Also, an anode slurry is prepared by mixing natural graphite carbon material (i.e., the anode active material 154), a styrene-butadiene copolymer (a binder resin), and carboxymethylcellulose (a thickener) in water at a ratio of 95:2.5:2.5 (ratio by weight). Then this anode slurry is applied to the surface of copper foil 158 and dried, after which the copper foil 158 with the dried anode coating is press-formed to obtain an anode 156 in which an anode composite 159 is applied to the surface of the aluminum foil 158 (see FIG. 5). In this example embodiment, natural graphite material which has a degree of graphitization of equal to or greater than 0.9, an average particle size of 20 μm, a lattice constant C0 of 0.67 nm, and a crystallite size Lc of 27 nm, is used as the natural graphite carbon material. Incidentally, in this example embodiment, the amounts of the cathode and anode slurries that are applied are adjusted so that the ratio of the theoretical capacity of the cathode and the theoretical capacity of the anode is 1:1.5.

Next, the electrode body 150 that has an oblong cross-section is formed by laying the cathode 155, the separator 157, and the anode 156 on top of one another in that order and rolling them up together (see FIGS. 4 and 5). However, when layering the cathode 155, the separator 157, and the anode 156 on top of one another, the cathode 155 is arranged so that a portion thereof to which the cathode composite 152 has not been applied protrudes out from one end of the electrode body 150. Further, the anode 156 is arranged so that a portion thereof to which the anode composite 159 has not been applied protrudes out from one the other end of the electrode body 150 (i.e., the end of the electrode body 150 opposite the end from which the portion of the cathode 155 to which the cathode composite 152 has not been applied protrudes out). Thus the electrode body 150 (see FIG. 3) having the cathode wound portion 155b and the anode wound portion 156b is formed. Incidentally, in this example embodiment, a composite porous membrane having three layers, i.e., one layer of polyethylene sandwiched between two layers of polypropylene, is used as the separator 157.

Next, the cathode wound portion 155b of the electrode body 150 is connected to the positive terminal 120 via the cathode collector member 122, and the anode wound portion 156b of the electrode body 150 is connected to the negative terminal 130 via the anode collector member 132. This is then placed into the rectangular housing portion 111 and the cover 112 is welded to the rectangular housing portion 111, thereby sealing the battery case 110. Next, electrolyte solution is poured in through a filler hole, not shown, in the cover 112, after which the filler hole is then sealed, thus completing each of the secondary batteries 100 of this example embodiment. Incidentally, in this example embodiment, the electrolyte solution may be made by dissolving 1 mol/liter of lithium hexafluorophosphate (LiPF$_6$) in a solution in which EC (ethylene carbonate) and DEC (diethyl carbonate) are mixed at a ratio of 4:6 (volume ratio).

Figure 7:
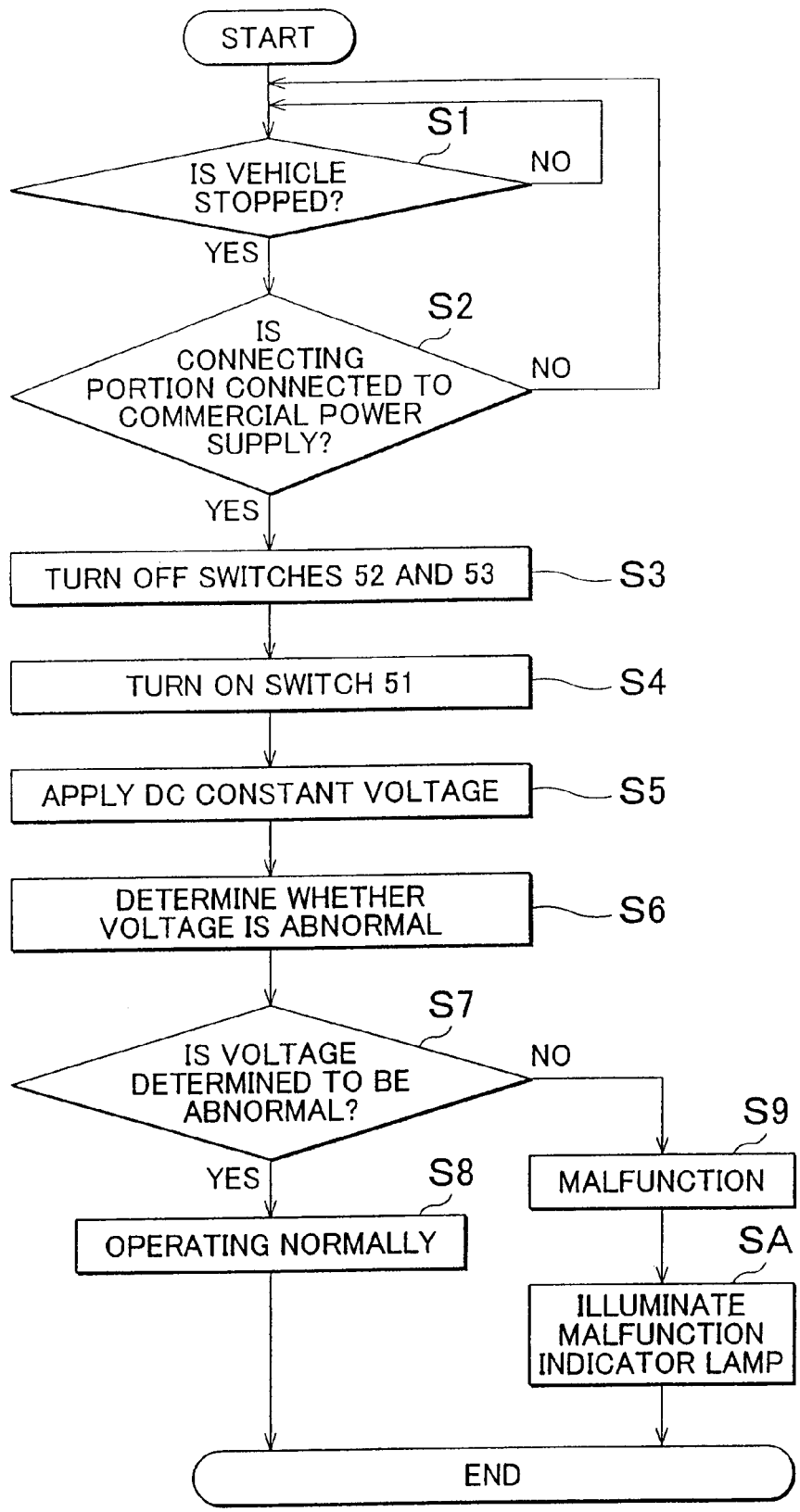
FIG. 7 is a flowchart illustrating the flow of a malfunction diagnostic method according to the example embodiment.

Next, a method of diagnosing a malfunction in the abnormal voltage detecting apparatus (i.e., the abnormal voltage determining portion 31 and the voltage sensor 40) of this example embodiment will be described. FIG. 7 is a flowchart illustrating the flow of the diagnostic method according to this example embodiment.

First, in step S1, it is determined whether the hybrid vehicle 1 is stopped based on a signal output at predetermined intervals of time from a control unit 60 that controls the hybrid vehicle 1. When the shift position is the N position or the P position, it is determined that the hybrid vehicle 1 is stopped and the control unit 60 outputs a stopped state signal indicating that the hybrid vehicle 1 is stopped to the battery controller 30. Therefore, when the battery controller 30 detects a stopped state signal from the control unit 60, it is determined that the hybrid vehicle 1 is stopped.

If it is determined in step S1 that the hybrid vehicle 1 is not stopped (i.e., No in step S1), then step S1 is performed again after a predetermined period of time has passed. If, on the other hand, it is determined that the hybrid vehicle 1 is stopped (i.e., Yes in step S1), then the process proceeds on to step S2 where it is determined whether the connecting portion 8 is electrically connected to the commercial power supply 80. More specifically, the battery controller 30 monitors the converting apparatus 20 (i.e., the AC/DC converter) and determines that the connecting portion 8 is electrically connected to the commercial power supply 80 when it has been confirmed that power has been supplied to the converting apparatus 20 from the commercial power supply 80 via the connecting portion 8.

If it is determined in step S2 that the connecting portion 8 is not electrically connected to the commercial power supply 80 (i.e., No in step S2), then the process returns to step S1.

If, on the other hand, it is determined in step S2 that the connecting portion 8 is electrically connected to the commercial power supply 80 (i.e., Yes in step S2), the process proceeds on to step S3 where the battery controller 30 turns the switches 52 and 53 off (i.e., opens the circuits) to break the electrical connection between the abnormal voltage detecting apparatus (i.e., the voltage sensor 40 and the battery controller 30) and the secondary batteries 100. Then the process proceeds on to step S4 where the battery controller 30 turns on the switch 51 (i.e., closes the circuit) to electrically connect the abnormal voltage detecting apparatus (i.e., the voltage sensor 40 and the abnormal voltage determining portion 31 of the battery controller 30) to the converting apparatus 20.

Next the process proceeds on to step S5 where the battery controller 30 directs the converting apparatus 20 to convert the voltage (such as AC 100 V) of the commercial power supply 80 into a DC constant voltage (such as DC 2.5 V or DC 4.0 V) having a constant voltage value (such as 2.5 V or 4.0 V) that is outside of the normal voltage range of the secondary batteries 100. As a result, DC constant voltage having a constant voltage value that is outside of the normal voltage range can be applied to the voltage sensor 40.

Next the process proceeds on to step S6 where the abnormal voltage determining portion 31 of the battery controller 30 determines whether the voltage is abnormal. If it is determined that the voltage is abnormal, then the abnormal voltage determining portion 31 outputs an abnormal voltage signal to the malfunction determining portion 32. If, on the other hand, it is determined that the voltage is not abnormal, then the abnormal voltage determining portion 31 does not output an abnormal voltage signal.

The process then proceeds on to step S7 where the malfunction determining portion 32 determines whether the abnormal voltage determining portion 31 has determined that the voltage is abnormal. More specifically, the malfunction determining portion 32 determines whether an abnormal voltage signal has been received from the abnormal voltage determining portion 31. If an abnormal voltage signal has been received, it means that the abnormal voltage determining portion 31 has determined the voltage to be abnormal (i.e., Yes in step S7) so the process proceeds on to step S8 where it is determined that the abnormal voltage detecting apparatus is operating normally.

If, on the other hand, an abnormal voltage signal has not been received, it means that the abnormal voltage determining portion 31 has not determined the voltage to be abnormal (i.e., No in step S7) so the process proceeds on to step S9 where it is determined that there is a malfunction in the abnormal voltage detecting apparatus. Then the process proceeds on to step SA where the malfunction determining apparatus 32 outputs a malfunction detected signal and illuminates the malfunction indicator lamp 55.

Accordingly, the person conducting the diagnostic is able to determine whether there is a malfunction in the abnormal voltage detecting apparatus (i.e., the voltage sensor 40 and the abnormal voltage determining portion 31) by checking whether the malfunction indicator lamp 55 is illuminated. More specifically, if malfunction indicator lamp 55 is illuminated, the person performing the diagnostic can determine that there is a malfunction in the abnormal voltage detecting apparatus. If, on the other hand, the malfunction indicator lamp 55 is not illuminated, the person performing the diagnostic can determine that the abnormal voltage detecting apparatus is operating normally.

Moreover, in the secondary battery system 6 of this example embodiment, the secondary batteries 100 that make up the battery pack 10 start to be charged using power supplied from the commercial power supply 80 after the malfunction diagnostic has been performed on the abnormal voltage detecting apparatus. More specifically, the switch 51 is turned off and the switches 52 and 53 are turned on after the malfunction determining portion 32 has determined whether the abnormal voltage detecting apparatus is operating normally (i.e., after step S8 or S9). Therefore, power from the commercial power supply 80 can be supplied via the converting apparatus 20 to the secondary batteries 100 that make up the battery pack 10, while the converting apparatus 20 converts the voltage of the commercial power supply 80 into DC constant voltage having a predetermined constant voltage value, thereby enabling the secondary batteries 100 that make up the battery pack 10 to be charged.

For example, in the secondary battery system 6 of this example embodiment, the secondary batteries 100 that make up the battery pack 10 start to be charged using power supplied from the commercial power supply 80 after the malfunction diagnostic has been performed on the abnormal voltage detecting apparatus, as described above. However, the secondary batteries 100 may also start to be charged using power supplied from the commercial power supply 80 while the malfunction diagnostic is being performed on the abnormal voltage detecting apparatus. For example, the switch 51 may be turned off and the switches 52 and 53 may be turned on after the DC constant voltage is applied to the voltage sensor 40 in step S5. As a result, the secondary batteries 100 that make up the battery pack 10 can start to be charged using the power supplied from the commercial power supply 80 while the diagnostic is being performed.

The determination as to whether there is a malfunction in the abnormal voltage detecting apparatus may be made by the controller or the like provided with the malfunction determining portion, or the determination results for the abnormal voltage detecting portion may be displayed externally (such as by an abnormal voltage indicator lamp) and the determination may be made by a person seeing that indication. Also, one example of the direct current voltage generating portion is a converting apparatus (such as an AC/DC converter) that is capable of converting voltage from an external power supply such as a commercial power supply into DC constant voltage that has a constant voltage value that is outside of the normal voltage range. Also, a battery prepared separately for a malfunction diagnostic (i.e., a battery in which the voltage between terminals is a constant voltage value that is outside of the normal voltage range) may be used instead of the secondary battery whose voltage is to be detected by the abnormal voltage detecting apparatus.

Incidentally, the direct current voltage generating portion may be provided in the secondary battery system or separately from the secondary battery system.

The cathode active material that performs two-phase charging-discharging refers to active material in which a charging-discharging reaction takes place while two crystals with different crystalline structures coexist. One example of this cathode active material is an olivine compound expressed by $LiFe_{(1-X)}M_XPO_4$ (where M is at least one of Mn, Cr, Co, Cu, Ni, V, Mo, Ti, Zn, Al, Ga, Mg, B, or Nb, and $0 \leq X \leq 0.5$) or $LiMn_{(1-X)}M_XPO_4$ (where M is at least one of Cr, Co, Cu, Ni, V, Mo, Ti, Zn, Al, Ga, Mg, B, or Nb, and $0 \leq X \leq 0.5$).

Also, the anode active material that follows a phase transition from charging and discharging refers to active material in which the crystalline structure changes during charging and discharging. One example of this cathode active material is carbon material. Examples of carbon material include natural graphite material, artificial graphite material (such as mesocarbon microbead), and non-graphite carbon material.

While the invention has been described with reference to example embodiments thereof, it is to be understood that the invention is not limited to the described embodiments or constructions. To the contrary, the invention is intended to cover various modifications and equivalent arrangements. In addition, while the various elements of the disclosed invention are shown in various example combinations and configurations, other combinations and configurations, including more, less or only a single element, are also within the scope of the appended claims.

The invention claimed is:

1. A method of diagnosing a malfunction in an abnormal voltage detecting apparatus, which determines whether there is a malfunction in the abnormal voltage detecting apparatus which detects the voltage of a secondary battery and determines that the voltage of the secondary battery is abnormal when the detected voltage value is outside of a normal voltage range, comprising:
   breaking an electrical connection between the abnormal voltage detecting apparatus and the secondary battery;
   connecting the abnormal voltage detecting apparatus to a direct current voltage generating portion which is different than the secondary battery and is able to generate direct current voltage that has a predetermined voltage value that is outside of the normal voltage range;
   applying the direct current voltage that has the predetermined voltage value that is outside of the normal voltage range to the abnormal voltage detecting apparatus using the direct current voltage generating portion; and
   determining that there is a malfunction in the abnormal voltage detecting apparatus if it is not determined by the abnormal voltage detecting apparatus that the voltage is abnormal,
   wherein the direct current voltage generating portion is structured to be able to generate direct current voltage that has a constant voltage value that is outside of the normal voltage range,
   wherein the direct current voltage generating portion includes a converting apparatus capable of converting voltage from an external power supply that is different than the secondary battery into the direct current voltage that has a predetermined voltage value that is outside of the normal voltage range, the method further comprising:
   electrically connecting the converting apparatus and the abnormal voltage detecting apparatus to the external power supply;
   converting the voltage from the external power supply into the direct current voltage; and
   applying the converted direct current voltage to the abnormal voltage detecting apparatus.

2. The method of diagnosing a malfunction in an abnormal voltage detecting apparatus according to claim 1, wherein the external power supply is a commercial power supply.

3. A secondary battery system comprising:
   a secondary battery;
   an abnormal voltage detecting apparatus which is able to be electrically connected to and disconnected from the secondary battery and detects the voltage of the secondary battery and determines that the voltage of the secondary battery is abnormal if the detected voltage value is outside of a normal voltage range; and
   a direct current voltage generating portion which i) is able to be electrically connected to and disconnected from the abnormal voltage detecting apparatus, ii) is able to generate direct current voltage that has a predetermined voltage value that is outside of the normal voltage range, and iii) is different than the secondary battery, wherein it is determined that there is a malfunction in the abnormal voltage detecting apparatus if the abnormal voltage detecting apparatus does not determine that the voltage of the secondary battery is abnormal when the abnormal voltage detecting apparatus is electrically disconnected from the secondary battery and connected to the direct current voltage generating portion, and the direct current voltage generating portion applies the direct current voltage to the abnormal voltage detecting apparatus, wherein the direct current voltage generating portion is structured to be able to generate direct current voltage that has a constant voltage value that is outside of the normal voltage range, wherein the secondary battery system further comprises:

a converting apparatus which i) is able to convert voltage from an external power supply into the direct current voltage, ii) is able to be electrically connected to the abnormal voltage detecting apparatus, and iii) is provided in the direct current voltage generating portion; and a connecting portion which is able to be electrically connected to the converting apparatus and the external power supply, and electrically connects the converting apparatus to the external power supply, wherein when the connecting portion is electrically connected to the external power supply, the secondary battery system breaks the electrical connection between the abnormal voltage detecting apparatus and the secondary battery, and electrically connects the abnormal voltage detecting apparatus to the converting apparatus and the connecting portion.

4. The secondary battery system according to claim 3, further comprising:

a malfunction determining portion which determines that there is a malfunction in the abnormal voltage detecting apparatus when the direct current voltage is applied to the abnormal voltage detecting apparatus and the abnormal voltage detecting apparatus does not determine that the voltage of the secondary battery is abnormal.

5. The secondary battery system according to claim 3, wherein the secondary battery is able to be charged using power supplied from the external power supply while the connecting portion is electrically connected to the external power supply.

6. The secondary battery system according to claim 5, wherein the secondary battery starts to be charged when the connecting portion is electrically connected to the external power supply, after a malfunction diagnostic has been performed on the abnormal voltage detecting apparatus or while the malfunction diagnostic is being performed on the abnormal voltage detecting apparatus.

7. The secondary battery system according to claim 3, wherein the external power supply is a commercial power supply.

8. The secondary battery system according to claim 3, wherein the secondary battery includes an electrode body that has a cathode, a separator, and an anode; the cathode includes cathode active material that performs two-phase charging-discharging; and the anode includes anode active material that follows a phase transition from charging and discharging.

9. A hybrid vehicle provided with the secondary battery system according to claim 3.

* * * * *

UNITED STATES PATENT AND TRADEMARK OFFICE
CERTIFICATE OF CORRECTION

| | |
|---|---|
| PATENT NO. | : 8,299,800 B2 |
| APPLICATION NO. | : 13/000695 |
| DATED | : October 30, 2012 |
| INVENTOR(S) | : Akira Tsujiko et al. |

It is certified that error appears in the above-identified patent and that said Letters Patent is hereby corrected as shown below:

Title Page, please insert the heading --(30) Foreign Application Priority Data-- and include the following priority information:

--June 25, 2008     (JP)     2008-165999--

Signed and Sealed this
Second Day of April, 2013

Teresa Stanek Rea
*Acting Director of the United States Patent and Trademark Office*